Dec. 15, 1970 R. J. HELLEN 3,548,204

ELECTRICAL FUNCTION GENERATOR

Original Filed May 4, 1965

2 Sheets-Sheet 1

INVENTOR.
RICHARD J. HELLEN
BY
ATTORNEY

Dec. 15, 1970 R. J. HELLEN 3,548,204

ELECTRICAL FUNCTION GENERATOR

Original Filed May 4, 1965 2 Sheets-Sheet 2

INVENTOR.
RICHARD J. HELLEN
BY
ATTORNEY

United States Patent Office 3,548,204
Patented Dec. 15, 1970

3,548,204

ELECTRICAL FUNCTION GENERATOR

Richard J. Hellen, Green Hills, Ohio, assignor to General Electric Company, a corporation of New York Continuation of application Ser. No. 453,022, May 4, 1965. This application May 9, 1969, Ser. No. 823,532
Int. Cl. G06g 7/12
U.S. Cl. 307—229 8 Claims

ABSTRACT OF THE DISCLOSURE

An electrical function generating circuit is shown in which there is proportionate amplification of an input signal over a limited middle range. When the input signal exceeds a given value, the positive feedback drives an amplifier to a maximum output level until the input signal is reduced to a given value. Various output signal functions may be generated through this use of positive and negative feedbacks.

Figure 1:
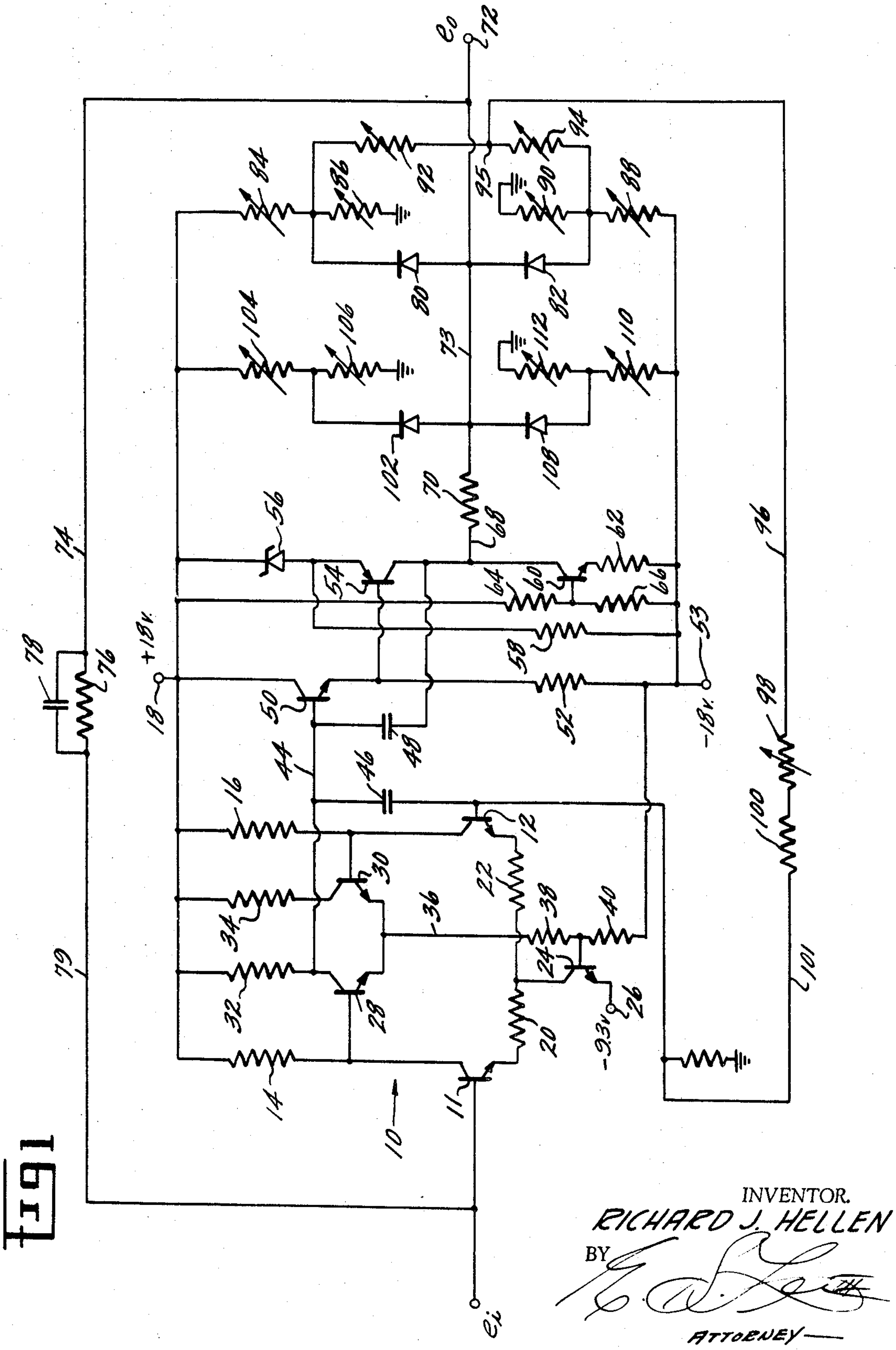

This application is a continuation of U.S. patent application Ser. No. 453,022 filed May 4, 1965, now abandoned.

The present invention relates to improvements in electrical function generators.

Electrical function generators are employed for many different purposes and find particular application in control circuits where it is desired that an element being controlled respond to a sensing or input signal in more than one fashion. In other words it is desired that the response will be different for different strengths of or cyclical variations in the input signal.

The object of the invention is to provide an improved electrical function generator in which an input signal will be proportionately amplified through a limited range and then amplified to a maximum value substantially instantaneously when the given range is exceeded and further in which the maximum value of the output signal will be maintained irrespective of subsequent changes in the input signal until the input signal is reduced below a given value whereupon the output signal will substantially instantaneously drop to whatever value the input signal would be amplified to within said limited range.

In a broader sense the object of the invention is to provide an improved electrical function generator in which the output signal of an amplifier is substantially instantaneously increased to a maximum value when the input signal exceeds a given strength and the output signal is maintained at said maximum value irrespective of changes in the input signal above a given minimum.

These ends are broadly attained by an electrical circuit comprising an electrical signal amplifier, having both regenerative and degenerative feedbacks which are summed with the input signal to the amplifier. A non-linear voltage breakdown device is provided in the positive feedback circuit. Thus, as an input signal increases from zero, the output signal is directionally proportionate thereto until the value of the non-linear voltage breakdown device is exceeded. At this point a regenerative feedback signal is summed with the input and degenerative feedback signals with the result that the amplifier is driven to saturation substantially simultaneously to provide an output signal of maximum value. This output signal will be independent of further variations in the value of the input signal until the magnitude of the input signal is such that the regenerative feedback signal strength is equal to that of the degenerative feedback signal strength, or at least substantially so. At this point, the regenerative feedback signal will no longer be effective in maintaining the amplifier at saturation and the non-linear voltage breakdown device will immediately become effective to prevent further flow through the regenerative circuit. The output signal will therefore collapse substantially instantaneously to a value reflecting normal amplification of the input signal.

In accordance with various features of the invention, both positive and negative output signals may be obtained and their maximum values may be made equal, preferably through the provision of a signal limiting circuit in the output from the amplifier. Further, the values of the output signal function may be symmetrical as to positive and negative ouput signals or assymmetrical as desired. Further, such symmetrical relationships may be generated so that the output signal equals zero when the input signal equals zero, or the output function may be translated to give a positive or negative signal where the input signal is zero.

Preferably these ends are obtained through the use of a differential operational amplifier of a known type having what is referred to as inverting and non-inverting inputs. Dependent upon the circuitry involved the output signal may be either of the same or inverse polarity of that of the input signal. Preferably, however, a ground referencing circuit is provided so that with a zero input signal there is a zero output signal. By passing the regenerative feedback signal through oppositely poled, identical diodes, having equal back voltages thereon, the regenerative feedback signal will be effective to drive the amplifier to saturation upon the output signal reaching the same given value, whether positive or negative. Thereafter, the output signal will represent the maximum amplification of the differential amplifier or any other amplification stages that might be provided therewith. The output signal will be independent of any further variations in the strength of the input signal, until the input signal has been reduced to a point where the regenerative signal strength approximates that of the degenerative signal. It is frequently desirable that the output signal drop to zero when the input signal has been reduced to zero. This end may be obtained by adjusting the regenerative feedback signal strength to that of the negative feedback strength when the input signal is at a zero value.

The above and other related objects and features of the invention will be apparent from a reading of the following description of the disclosure found in the accompanying drawings and the novelty thereof pointed out in the appended claims.

Figure 6:
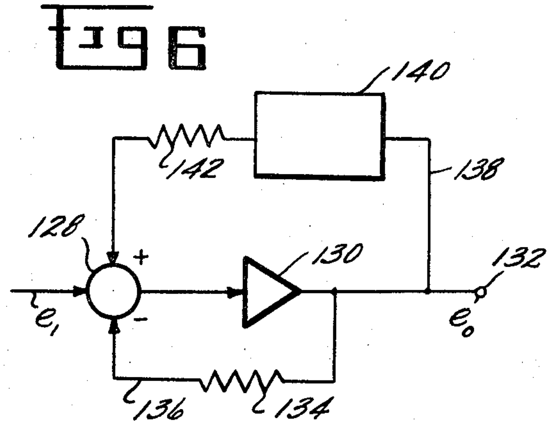

In the drawings:

FIG. 1 is a schematic of an electrical circuit embodying the present invention;

FIGS. 2, 3, 4, and 5 illustrate output signal functions which may be generated by the circuit illustrated in FIG. 1; and FIG. 6 is a block diagram illustrating the broader aspects of the invention.

FIG. 1 illustrates a preferred circuit for accomplishing the objectives above set forth. A two stage differential amplifier, indicated generally by reference character 10, comprises a pair of NPN transistors 11 and 12, the collectors of which are respectively connected through load resistors 14 and 16 to the positive terminal of a power supply (not shown) through line 18 and having an exemplary voltage of plus 18 volts. The emitters of the transistors 11 and 12 are connected respectively through emitter resistors 20 and 22 to the collector of a transistor 24. The emitter of the transistor 24 is connected to a negative terminal of the power supply indicated at 26 and having an exemplary voltage of minus 9.3 volts. The amplifier 10 is provided with a second stage of differential amplification comprising transistors 28 and 30, the collectors of which are respectively connected to the positive output tap 18 of power supply through resistors 32, 34. The emitters of the transistors 28 and 30 are tied together through line 36 to resistors 38, 40, and then to a negative terminal 53 of the power supply which has an exemplary voltage of minus 18 volts. The base of transistor 24 is connected between the resistors 38 and 40 to provide a common mode of feedback as well as to enable the transistor 24 to function in a manner providing constant current flow therethrough.

An input signal $e_i$ is impressed on the base of the transistor 11. The input signal is amplified by the transistors 11 and 12 and then by the transistors 28 and 30, the described amplifier circuit providing a high gain with a large input impedance and high common mode rejection, according to known principles of operation. Output of the amplifier is taken from the collector of the transistor 28 through conductor 44. Capacitances 46 and 48 are provided as illustrated to prevent oscillation.

The output of the differential amplifier 10 is further amplified by a power transistor 50, means for maintaining the conductor 44 being connected to the base thereof. The transistor 50 has its collector connected to the positive terminal of the power supply represented by line 18, and its emitter is connected through a resistor 52 to the negative tap 53 of the power supply.

This further amplified signal is next connected to a zero or ground referencing circuit which comprises a PNP transistor 54, the base of which is connected to the emitter of the transistor 50. The emitter of the transistor 54 is connected to the positive tap 18 of the power supply through a Zener diode 56 and to the negative tap 53 of the power supply through a resistor 58. The collector of the transistor 54 is connected to the collector of an NPN transistor 60; the emitter of this transistor is connected to the negative tap 53 of the power supply through a resistor 62. The base of the transistor 60 is connected intermediate resistors 64 and 66 which are connected in series across the positive (18) and negative (53) taps of the power supply.

The values chosen for the elements 54 through 66 are such that when there is no input to the transistor 11, there is no output through conductor 68. Further, if there is a positive input signal $e_i$, then there will be an amplified negative output signal on the conductor 68 and correspondingly, if there is a negative input signal to the transistor 11, there will be an amplified positive output signal on the conductor 68.

This output signal current flows through a resistance 70 to an output terminal 72 connected thereto by conductor 73.

The output terminal 72 may be connected to whatever means are to be controlled by or to be responsive to the input signal. The circuitry described thus far is conventional and known to those skilled in the art. This circuitry further includes a degenerative feedback circuit, also known per se, comprising a conductor 74 connecting conductor 73 to a resistance 76 and capacitance 78 in parallel therewith and a conductor 79 connected to the base of the transistor 11. Degenerative feedback is provided for the normal purposes of a stability in and a linear output from the amplifier and for other purposes which are later described.

In order to accomplish the objects of the present invention, the further provision of a regenerative feedback signal is essential. This regenerative feedback signal is derived from a circuit which includes silicon diodes 80, 82, which are oppositely poled in being connected to the conductor 73. Diode 80 is also connected intermediate resistances 84, 86, which are connected in series from the positive power supply tap (18) to ground. Diode 82 is also connected intermediate resistance 88, 90, which are connected in series from the negative power supply tap (53) to ground. Resistances 92 and 94 are connected in series from a point intermediate the resistances 84, 86, to a point intermediate the resistances 88, 90. The regenerative feedback is connected by conductor 96 from a juncture 95 intermediate resistances 92, 94, through resistance 98 and resistance 100, back to the base of the transistor 12 through conductor 101. Advantageously the values of resistances 84–94 are selected or adjusted so that there is zero potential at juncture 95 when there is no current flowing through diodes 80 or 82 and any given current flow through either of these diodes will generate the same potential, but opposite polarity at juncture 95.

Below a given level of output signal strength at the output terminal 72 (also conductor 73), diodes 80 and 82 will prevent any current flow through the positive feedback circuit. The strength of the output signal will increase proportionately with, but in the opposite polarity to the input signal, in accordance with the gain characteristics of the amplifier circuit. This will be apparent from FIG. 2 where $e_i$ is plotted against $e_o$. As $e_i$ increases $e_o$ increases along line *a*, but with a polarity inversion until the input signal strength is increased to bring the negative output signal strength to a given value at which the diode 82 becomes conductive. At this point a feedback signal is applied to the amplifier 10. By applying this feedback signal to the transistor 12 which is the so-called non-inverting input of the differential amplifier, a regenerative feedback is obtained which almost instantaneously drives the overall amplifier circuit to saturation, and the output signal strength increases along line *b* to a maximum negative value. Thereafter further increases in the input signal strength cause no further increase in the output signal strength, as represented by line *c* in FIG. 2. Likewise, once a regenerative feedback signal has been passed by diode 82, the output signal strength will remain at a maximum value until the input signal strength has been reduced substantially to zero; this is indicated by the portion of line *c* to the left of line *b*. However, when the output signal strength approximates or reaches zero, regenerative feedback is cut off and the output signal strength diminishes to zero almost instantaneously as indicated by line *d*.

While it is convenient, in considering the nature of the output signal function generated, to refer to output sigal strength, the collapse of the output signal at zero input signal strength is, however, dependent upon the relative strengths of the regenerative and degenerative feedback signals. This is to say that the resistance 98 is adjusted so that the regenerative and degenerative feedback signals are equal, or approximately so, when the input signal is reduced to zero and thus the described output signal function generation is obtained.

Where the input signal $e_i$ is negative, the output signal $e_o$ increases proportionately in a positive direction along line *e* until the diode 80 becomes conductive, whereupon a positive feedback is applied to the amplifier 10 and the amplifier circuit is driven to saturation almost instantaneously as indicated by line *f* to a maximum value shown by line *g*. Again the output signal strength is maintained at this maximum level regardless of variations in the input signal strength until the input signal strength is reduced substantially to zero, whereupon the positive feedback signal, being equal to or slightly less than the negative feedback signal, is cancelled out and the output signal strength collapses along line *h*, again to zero.

By matching the values of the two halves of the positive feedback circuit, as indicated in connection with resistances 84–94, and selecting diodes 80, 82 having the same characteristics, the output function which is generated is symmetrical in that the input signal is amplified in like fashion along lines *a*, or *e*, and the amplifier circuit is driven to saturation along lines *b*, or *f* when the input signal strength reaches a given value, whether positive or negative.

It is also preferable that the output of signal function be symmetrical in having like maximum positive and negative output signal strength levels. In order to more positively assure such matching of maximum output signal strengths, it is preferable to include an output limit circuit comprising a diode 102 connected between the output conductor 73 and a point intermediate voltage dividing resistors 104, 106, which in turn are connected in series from the positive power supply tap 18 to ground. A second oppositely poled diode 108 is connected between the output conductor 73 and a point intermediate voltage dividing resistors 110, 112, which in turn are connected in series between the negative power supply tap 53 and ground. The values of the resistors 104 and 106 are selected such that when a positive output signal strength exceeds a given value, say 10 volts, the diode 102 will become conductive and any voltage in excess of 10 volts will be bypassed to ground. Similarly, the values of the resistances 110 and 112 are selected such that when a negative output signal strength exceeds the same given value, minus 10 volts, the diode 108 becomes conductive and any negative output signal in excess of 10 volts is thus bypassed to ground.

Figure 3:
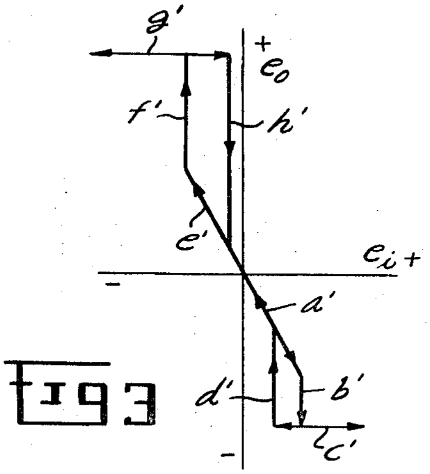
Figure 4:
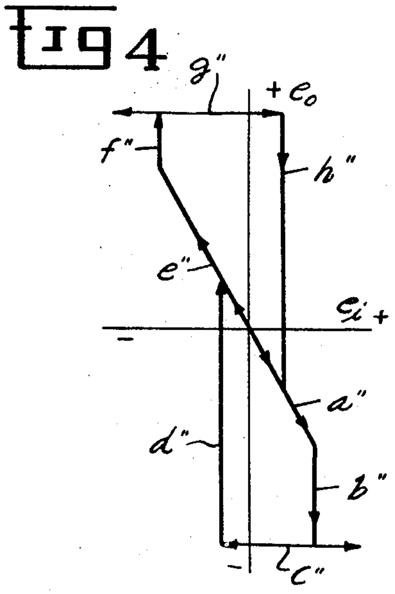
Figure 5:
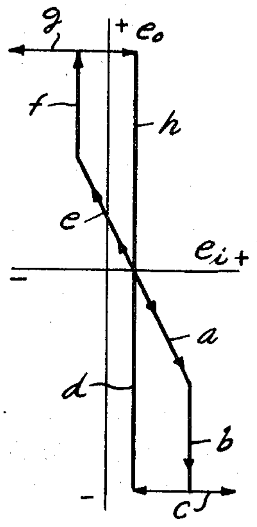

The present concepts are adaptable for many control purposes because of the variations which can be made in the basic function pattern. The circuit, as thus far described generates a symmetrical output response to both positive and negative input signals. There are four primary parameters involved in obtaining this symmetrical output. These parameters include the current limiting circuits through diodes 102, 108 (necessary on the assumption that the gain of the amplifier 10 will normally be different for positive and negative signals); passing of a regenerative signal through the diodes 80, 82 when the positive or negative output signal is at the same value except for polarity; nulling of the regenerative circuit when no signal is being passed by the diodes 80, 82, i.e. juncture 95 is at zero potential; and the relative strengths of the regenerative and degenerative feedback signals. FIGS. 3, 4, and 5 illustrate typical output functions which can be obtained by varying these parameters.

In FIG. 3, it will be noted that the same general type of function is generated in that with an increase in a positive input signal, there is a progressive increase of a negative output signal along line *a'* until the positive feedback circuit becomes conductive, whereupon the output signal strength increases along line *b'* to a level *c'* as saturation occurs and as controlled by the limit circuit comprising diodes 108 and resistances 110 and 112. However, the strength of the regenerative feedback signal has been reduced by adjusting the value of resistance 98 so that when the input signal strength is reduced to a value which, summed with the degenerative feedback signal approximates the regenerative signal strength, the output signal immediately collapses along line *d'* back to a point on line *a'* to zero. If the input signal becomes negative, it is amplified to give progressively increasing positive output signal along line *e'*, until the positive feedback circuit again becomes operative and the negative input signal is amplified substantially instantaneously to a maximum value along line *f'* to level *g'*. When the input signal strength is reduced to a given value, again greater than zero, the output signal collapses along line *h'* to line *e'*. It will be noted that the maximum value (line *g'*) of the positive output signal strength is greater than that of the maximum negative output signal strength (line *c'*) which result has been obtained by varying the relative values of resistances 104, and/or 106 to obtain a higher back voltage on the diode 102. It will also be noted that since the positive regenerative signal strength is greater than that of the negative regenerative signal strength, the positive output signal collapses from its maximum value (on line *h'*) when then the input signal is decreased to a lesser value than that required to collapse the negative output signal (on line *d'*). The maximum value of the negative output signal may likewise be varied by adjusting the values of resistances 110 and/or 112.

In FIG. 4 the positive feedback signal strength has been increased, again by adjustment of resistance 98, so that the input signal actually reversed polarity before the degenerative feedback signal strength equals that of the regenerative feedback signal. Thus, starting with an input signal strength of zero and progressively increasing that signal in a positive direction, the negative output signal will be amplified along line *a''* until there is regenerative feedback. This time the output signal will simultaneously increase along line *b''* to a maximum level *c''*. The input signal strength is actually reversed in polarity to obtain a summonation of the input and degenerative signals which approximates the regenerative feedback strength in order that the output signal will collapse along line *d''* to line *e''*, which represents normal amplification of a negative input signal. With regenerative feedback from a negative input signal the output signal increases along line *f''* to a maximum level *g''*. Before there can be a reversal in polarity of the output signal, the input signal must again return to a positive polarity in order that the output signal can collapse along line *h''* to line *a''*. Once on line *a''* or *e''* the output signal strength will be proportional to the amplification factor of the amplifier. It will also be noted that lines *a''* and *e''* are coextensive between lines *d''* and *h''*.

In FIG. 4 it will also be noted that the output function is further asymmetrical in that a higher value negative input signal was required to shift (on line *f''*) the output signal to its maximum value as compared to the value of the positive input signal required for obtaining a maximum output signal. This end was obtained by varying the values of resistances 84 and/or 86 to increase the back voltage on diode 80. At the same time the value of resistance 92 and/or 94 are varied to maintain a zero potential at juncture 95 when there is no signal flow through either of the diodes 80 or 82.

Figure 2:
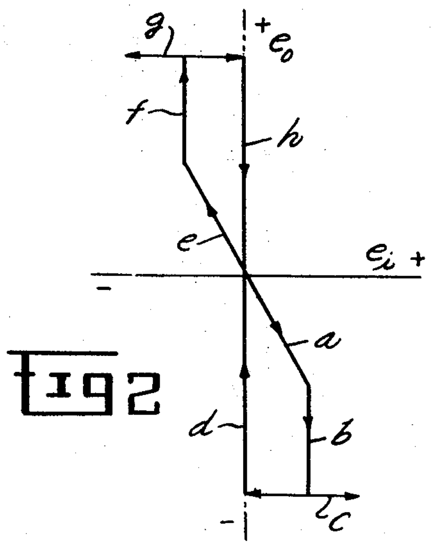

FIG. 5 shows an output function identical with that of FIG. 2 except that it has been translated from the zero input signal reference. (In FIG. 5 the lines representing the plot of the output signal are identified by the same reference characters as in FIG. 2.) To obtain this translation, the circuit of FIG. 1 has been modified by adjusting the values of resistances 92 and/or 94 so that with no signal flow through diodes 80 or 82 there is a voltage potential at the juncture 95 causing a further input to the amplifier 10 which is simply summed with the input signal $e_i$.

It will of course be appreciated that fixed value resistors may be selected or other components modified to establish the function-defining parameters for generation of a specific output function.

Reference will now be made to FIG. 6 showing a block diagram illustrating the broader concepts of the present invention. Thus, an input signal, $e_i$, is fed to a summing point 128 and then to an amplifier 130. The output, $e_o$, of the amplifier is taken from an output terminal 132. Degenerative feedback is provided from the output terminal 132 across a resistor 134 and line 136 to the summing point 128. Regenerative feedback is provided from the output terminal 132 through line 138 to a non-linear voltage breakdown device 140, and from the device 140 across resistor 142 back to the summation point 128. So long as there is no current flow through the regenerative feedback circuit the output characteristics of the amplifier will be in accordance with the usual characteristics of the amplifier. However, once the non-linear voltage breakdown device becomes conductive, regenerative feedback is fed to the summation point 128 and the amplifier is driven to saturation, as previously described. Once the value of the regenerative feedback signal approximates or is slightly less than that of the degenerative feedback, the regenerative feedback signal will be removed and the amplifier will return to normal functioning.

While the circuit shown and described in connection with FIG. 1 is to be preferred, alternate circuitry will be apparent to those skilled in the art within the broader concepts of FIG. 6 and within the broader limits of the invention which are to be derived from the following claims.

Having thus described the invention, what is claimed as novel and desired to be secured by Letters Patent of the United States is:

1. An electrical function generator comprising, a differential operation amplifier having an inverting and a non-inverting input, said amplifier being adapted to amplify an input signal impressed on one of said inputs, said amplifier including a ground referencing circuit for adjusting the output of said amplifier so that with a zero value input signal, there is a zero value output, whereby the output signal may be either positive or negative dependent upon the polarity of the input signal, degenerative feedback means connecting the output of said amplifier with and providing a signal, continuously proportional to the amplifier output signal, to one of the inputs thereto, regenerative feedback means connecting the output of said amplifier with and providing a signal to the other of said inputs to said amplifier, said regenerative feedback means, including oppositely poled diodes for selectively passing positive and negative regenerative signals, and means providing a back voltage on said diodes to prevent passing of a regenerative signal until the output signal reached a predetermined magnitude, said regenerative feedback means providing a regenerative signal of a strength sufficient to drive the amplifier to saturation substantially instantaneously upon the passage of a regenerative signal through one of said diodes.

2. An electrical function generator as in claim 1 wherein the means providing back voltages on said diodes comprise a pair of voltage dividers respectively connected between positive and negative voltage potentials and ground, and the diodes are respectively connected to an intermediate point on said voltage dividers, and further wherein a pair of resistors are connected in series between intermediate points on said voltage dividers, and a conductor connected intermediate said pair of resistors provides a common path for both positive and negative regenerative signals passing to said amplifier.

3. An electrical function generator as in claim 1 wherein means are provided for approximating the strength of the regenerative feedback signal to that of the degenerative feedback signal when the input signal is zero whereby the output signal will remain at a maximum value, once the amplifier has been driven to saturation, until the input signal is reduced to zero.

4. An electrical function generator as in claim 1 wherein, a pair of oppositely poled limiting diodes are connected to the output of said amplifier and means provide back voltages thereon of a greater magnitude than the back voltage on the diodes of the regenerative feedback means and of a lesser magnitude of the output signal when the amplifier means is driven to saturation thereby limiting the magnitude of both positive and negative output signals to predetermined values.

5. An electrical function generator as in claim 4 wherein, the limiting diodes have essentially the same characteristics and the back voltage means provide back voltages of equal magnitude thereon.

6. A direct current electrical function generator comprising, direct current amplifier means for amplifying an input signal and providing an output signal of increasing magnitude from ground, proportionate to the magnitude of an input signal, and of a polarity dependent upon the polarity of the input signal, means directly responsive to the output signal for providing a continuously proportional degenerative feedback signal of opposite polarity to said input signal, means directly responsive to the output signal for providing a regenerative feedback signal of the same polarity as said input signal, means preventing operation of said regenerative feedback signal means only when the output signal strength is below a given magitude substantially below the saturation output signal strength of the amplifier means, and means for summing the input signal, the regenerative signal and the degenerative signal to provide an input to said amplifier means, whereby, when the summation of the input signal and the degenerative signal provides an amplifier output signal below said given magnitude, the input signal is proportionately amplified; when the strength of the input signal causes the output signal to exceed said given magnitude, the regenerative signal is included in said summing means and the amplifier is driven to saturation to provide a maximum output signla; and, after the amplifier is driven to saturation and then the input signal is decreased in magnitude such that the combined values of the input and degenerative signals approximate the regenerative signal of opposite polarity, the output signal falls below said given magnitude and the preventing means immediately cut off the regenerative signal, returning operation of the amplifier means to its normal proportional amplification function.

7. A function generator as in claim 6 wherein, means for maintaining the regenerative feedback means at ground potential so long as the preventing means are effective, and the effective regenerative signal strength approximates that of the degenerative signal when the input signal is zero.

8. A function generator as in claim 7 wherein, means are provided for limiting the magnitude of both positive and negative output signals to the same predetermined value.

(References on following page)

References Cited

UNITED STATES PATENTS

| | | | |
|---|---|---|---|
| 2,767,314 | 10/1956 | Yu | 331—146 |
| 3,206,685 | 9/1965 | Polasek | 328—142 |
| 3,225,216 | 12/1965 | Grabowski | 307—235 |
| 3,353,033 | 11/1967 | Gilbert | 307—235 |
| 3,356,961 | 12/1967 | Sedlmeyer | 330—104 |

| | | | |
|---|---|---|---|
| 3,328,705 | 6/1967 | Eubanks | 307—235 |
| 3,394,266 | 7/1968 | Martin et al. | 307—235 |

DONALD D. FORRER, Primary Examiner

H. A. DIXON, Assistant Examiner

U.S. Cl. X.R.

307—290; 328—142; 330—69